(12) United States Patent
Smart (10) Patent No.: US 6,727,458 B2
(45) Date of Patent: Apr. 27, 2004

(54) ENERGY-EFFICIENT, LASER-BASED METHOD AND SYSTEM FOR PROCESSING TARGET MATERIAL

(75) Inventor: Donald V. Smart, Boston, MA (US)

(73) Assignee: GSI Lumonics, Inc., Kanata (CA)

( * ) Notice: Subject to any disclaimer, the term of this patent is extended or adjusted under 35 U.S.C. 154(b) by 157 days.

(21) Appl. No.: 09/941,389

(22) Filed: Aug. 28, 2001

(65) Prior Publication Data

US 2002/0023901 A1 Feb. 28, 2002

Related U.S. Application Data

(63) Continuation of application No. 09/473,926, filed on Dec. 28, 1999, now Pat. No. 6,281,471.

(51) Int. Cl.[7] .............................................. B23K 26/00

(52) U.S. Cl. ........................... 219/121.62; 219/121.68; 219/121.69

(58) Field of Search .................. 219/121.6, 121.61, 219/121.62, 121.67, 121.68, 121.69, 121.7, 121.71, 121.72, 1

(56) References Cited

U.S. PATENT DOCUMENTS

| | | |
|---|---|---|
| 4,114,018 A | 9/1978 | Allmen et al. |
| 4,399,345 A | 8/1983 | Lapham et al. |
| 4,483,005 A | 11/1984 | Smart |
| 5,021,362 A * | 6/1991 | Chlipala |

(List continued on next page.)

FOREIGN PATENT DOCUMENTS

| | | |
|---|---|---|
| EP | 0 367 507 A2 | 5/1990 |
| JP | 06142968 | 5/1994 |
| WO | WO 96/16484 | 5/1996 |

OTHER PUBLICATIONS

Bernstein, Joseph B., et al., Analysis of Laser Metal–Cut Energy Process Window, pp. 1–7.

Xenon Laser Repairs Liquid Crystal Displays, Lasers and Optronics, Apr. 1998, pp. 39–41.

Scarfone, L.M., et al., Computer Simulation of Target Link Explosion in Laser Programmable Redundancy for Silicon Memory, 1986, p. 371.

(List continued on next page.)

Primary Examiner—Samuel M. Heinrich
(74) Attorney, Agent, or Firm—Brooks Kushman P.C.

(57) ABSTRACT

An energy-efficient method and system for processing target material such as microstructures in a microscopic region without causing undesirable changes in electrical and/or physical characteristics of material surrounding the target material is provided. The system includes a controller for generating a processing control signal and a signal generator for generating a modulated drive waveform based on the processing control signal. The waveform has a sub-nanosecond rise time. The system also includes a gain-switched, pulsed semiconductor seed laser for generating a laser pulse train at a repetition rate. The drive waveform pumps the laser so that each pulse of the pulse train has a predetermined shape. Further, the system includes a laser amplifier for optically amplifying the pulse train to obtain an amplified pulse train without significantly changing the predetermined shape of the pulses. The amplified pulses have little distortion and have substantially the same relative temporal power distribution as the original pulse train from the laser. Each of the amplified pulses has a substantially square temporal power density distribution, a sharp rise time, a pulse duration and a fall time. The system further includes a beam delivery and focusing subsystem for delivering and focusing at least a portion of the amplified pulse train onto the target material. The rise time (less than about 1 ns) is fast enough to efficiently couple laser energy to the target material, the pulse duration (typically 2-10 ns) is sufficient to process the target material, and the fall time (a few ns) is rapid enough to prevent the undesirable changes to the material surrounding the target material.

58 Claims, 5 Drawing Sheets

U.S. PATENT DOCUMENTS

| | | | |
|---|---|---|---|
| 5,059,764 A | | 10/1991 | Baer |
| 5,197,074 A | * | 3/1993 | Emmons, Jr. et al. |
| 5,208,437 A | | 5/1993 | Miyauchi et al. |
| 5,265,114 A | | 11/1993 | Sun et al. |
| 5,293,025 A | * | 3/1994 | Wang |
| 5,400,350 A | | 3/1995 | Galvanauskas |
| 5,473,624 A | | 12/1995 | Sun |
| 5,520,679 A | | 5/1996 | Lin |
| 5,539,764 A | | 7/1996 | Shields et al. |
| 5,558,789 A | | 9/1996 | Singh |
| 5,569,398 A | | 10/1996 | Sun et al. |
| 5,586,138 A | | 12/1996 | Yokoyama |
| 5,627,848 A | | 5/1997 | Fermann et al. |
| 5,656,186 A | | 8/1997 | Mourou et al. |
| 5,662,822 A | | 9/1997 | Tada et al. |
| 5,685,995 A | * | 11/1997 | Sun et al. |
| 5,742,634 A | | 4/1998 | Rieger et al. |
| 5,751,585 A | | 5/1998 | Cutler et al. |
| 5,920,668 A | | 7/1999 | Uehara et al. |
| 6,151,338 A | * | 11/2000 | Grubb et al. |
| 6,552,301 B2 | | 4/2003 | Herman et al. |
| 6,574,250 B2 | | 6/2003 | Sun et al. |

OTHER PUBLICATIONS

Mitani, Masao, et al., Laser Cutting of Aluminum Thin Film With No Damage to Under–Layers, Annals Of The CIRP. vol. 28/1, 1979, pp. 113–116.

Liu, Xinbing, et al., Ultrashort Laser Pulses Tackle Precision Machining, Laser Focus World, Aug. 1997, pp. 101–118.

Bado, Philippe, Ultrafast Lasers Escape The Lab, Photonics Spectra, Jul. 1998, pp. 157–161.

Ready, John F., Effects of High Power Laser Radiation, Academic Press, New York 1971, pp. 115–116.

Charschan, Sidney S., Guide For Material Processing By Lasers, Laser Institute of America, The Paul M. Harrod Company, Baltimore, Md., 1977, pp. 5–13.

Litwin, et al., Laser Adjustment of Linear Monolithic Circuits, ICAELO, vol. 38, 100/L.I.A., 1983.

Raevsky, Eugene V., et al., Stabilizing the Output of A Pockels Cell Q–Switched Nd:YAG Laser, Optical Engineering No. 38, vol. 11., pp. 1781–1784, Nov. 1999.

Gu, Jianhui, et al., Passive Q–Switching of A Nd:YAG Laser With A GaAs Output Coupler, Optical Engineering, No. 38, vol. 11, pp. 1785–1788, Nov. 1999.

Jandeleit, J., et al., Picosecond Laser Ablation of Thin Copper Films, Applied Physics A, A 63, 117–121, 1996.

Zhu, X., et al., Influence of Aser Parameters And Material Properties On Micro Drilling With Femtosecond Laser Pulses, Applied Physics A, A 69, pp. 367–S371, 1999.

* cited by examiner

ENERGY-EFFICIENT, LASER-BASED METHOD AND SYSTEM FOR PROCESSING TARGET MATERIAL

CROSS REFERENCE TO RELATED PATENT AND APPLICATION

This application entitled Energy-Efficient, Laser-Based Method And System For Processing Target Material is: A continuation application under 37 C.F.R. §1.53(b) of prior application Ser. No. 09/473,926 filed on Dec. 28, 1999, entitled Energy-Efficient, Laser-Based Method And System For Processing Target Material, now U.S. Pat. No. 6,281,471.

This application is related to U.S. patent application Ser. No. 09/156,895, filed Sep. 18, 1998, entitled "High Speed Precision Positioning Apparatus". This application is also related to U.S. Pat. No. 5,998,759 (i.e., the '759 patent) entitled "Laser Processing", having the same assignee as the present invention. The entire disclosure of the '759 patent is hereby expressly incorporated by reference.

TECHNICAL FIELD

This invention relates to energy-efficient, laser-based methods and systems for processing target material. In particular, this invention relates to the use of a pulsed laser beam to ablate or otherwise alter a portion of a circuit element on a semiconductor substrate, and is particularly applicable to vaporizing metal, polysilicide and polysilicon links for memory repair. Further application can be found in laser-based micromachining and other repair operations, particularly when it is desired to ablate or modify a microscopic structure without damaging surrounding areas and structures, which often have non-homogeneous optical and thermal properties. Similarly, the material processing operations can be applied to other microscopic semiconductor devices, for instance microelectromechanical machines. Medical applications may also exist, such as microscopic tissue or cell ablation with miniature fiber optic probes.

BACKGROUND OF THE INVENTION

Semiconductor devices such as memories typically have conductive links adhered to a transparent insulator layer such as silicon oxide, which is supported by the main silicon substrate. During laser processing of such semiconductor devices, while the beam is incident on the link or circuit element, some of the energy also reaches the substrate and other structures. Depending upon the power of the beam, length of time of application of the beam, and other operating parameters, the silicon substrate and/or adjacent can be overheated and damaged.

Several prior art references teach the importance of wavelength selection as a critical parameter for substrate damage control. U.S. Pat. Nos. 4,399,345, 5,265,114, 5,473,624, 5,569,398 disclose the benefits of wavelength selection in the range beyond 1.2 um to avoid damaging silicon substrates.

The disclosure of the above-noted '759 patent further elaborates on the wavelength characteristics of silicon. The absorption in silicon rapidly drops off after about one micron with an absorption edge of about 1.12 microns at room temperature. At wavelengths greater than 1.12 microns, the silicon starts to transmit more and more easily and, thus, it is possible to obtain better part yields upon removing material from the silicon. In the range around 1 micron the absorption coefficient decrease by a factor of four orders of magnitude going from 0.9 microns to 1.2 microns. In going from the standard laser wavelength of 1.047 microns to 1.2 microns the curve shows a drop of two orders of magnitude. This shows a drastic change in absorption for a very slight change in wavelength. Thus, operating the laser at a wavelength beyond the absorption edge of the substrate circumvents damage to the substrate, which is especially important if there is a slight misalignment of the laser beam with respect to the link or where the focused spot extends beyond the link structure. Furthermore, if the substrate temperature rises during processing the absorption curve shifts will shift further into the infrared which can lead to thermal runaway conditions and catastrophic damage.

The problem of liquid crystal repair is similar to the problem of metal link ablation. The wavelength selection principle for maximizing absorption contrast was advantageously applied in the green wavelength region in a manner analogous to the above disclosures for the same purpose—namely removal of metal without substrate damage. The system manufactured by Florod is described in the publication "Xenon Laser Repairs Liquid Crystal Displays", LASERS AND OPTRONICS, pages 39–41, April 1988.

Just as wavelength selection has proven to be advantageous, it has been recognized that other parameters can be adjusted to improve the laser processing window. For example, it was noted in "Computer Simulation of Target Link Explosion in Laser Programmable Redundancy for Silicon Memory" by L. M. Scarfone and J. D. Chlipala, 1986, p. 371, "It is desirable that laser wavelengths and various material thicknesses be selected to enhance the absorption for the link removal process and reduce it elsewhere to prevent damage to the remainder of the structure." The usefulness, in general, of thicker insulative layers underneath links or circuit elements and the usefulness of limiting the duration of heating pulses has also been recognized, as in the paper co-authored by the applicant, "Laser Adjustment of Linear Monolithic Circuits," Litwin and Smart, 100/L.I.A., Vol. 38, ICAELO (1983).

The '759 patent teaches the tradeoffs that exist with selection of the longer wavelengths—specifically compromises with respect to spot size, depth of focus, and pulse width, available from Nd:YAG lasers. These parameters are of critical importance for laser processing at increasingly fine dimensions, and where the chances of collateral damage to surrounding structures exist.

In fact, any improvement which widens the processing window is advantageous as the industry continues to push toward higher density microstructures and the associated geometries which are a fraction of one micron in depth or lateral dimension. The tolerances of energy control and target absorption become large compared to the energy required to process the microstructure at this scale. It should be noted from the above discussion that laser processing parameters are not necessarily independent in micromachining applications where a small laser spot, about 1 µm, is required. For instance, the spot size and pulse width are generally minimized with short wavelengths, say less than 1.2 µm, but the absorption contrast is not maximized. Makers of semiconductor devices typically continue production of earlier developed products while developing and entering production of more advanced versions that typically employ different structures and processes. Many current memory products employ polysilicide or polysilicon links while smaller link structures of metal are used for more advanced products such as the 256-megabit memories. Links of 1 micron width, and ⅓ micron depth, lying upon a thin silicon oxide layer of 0.3 to 0.5 microns are being used in such large memories. Production facilities traditionally have utilized Q-switched diode pumped YAG lasers at and related equipment capable of operating at the conventional wavelengths of 1.047 μm–1.32 μm and related equipment capable of operating in the wavelength region recognized for its lower absorption by silicon. However, these users also recognize the benefits of equipment improvements which results in clean severing of link structures without the risk of later chip failures due to conductive residue or contamination near the ablation site.

Other degrees of freedom include laser pulse energy density (delivered to the target) and pulse duration. It has been taught in the prior art that pulse width should be limited to avoid damage in micromachining applications. For example, in U.S. Pat. No. 5,059,764 a laser processing workstation is disclosed wherein a q-switched laser system is utilized to produce, among other things, relatively short pulses on the order of 10–50 ns. It was disclosed that for material processing applications (like semiconductor memory repair via link blowing and precision engraving), the output pulse width should be relatively short—and that a pulse width less than 50 ns is required in many applications, for example 30 ns. The proper choice of pulse width allows for ablation (evaporation without melting).

High speed pulsed laser designs may utilize Q-switched, gain switched, or mode-locked operation. The pulse duration and shape of standard Q-switched and other pulsed lasers can be approximated at a fundamental level by integrating the coupled rate equations describing the population inversion and the photon number density relative to the lasing threshold at the start of the pulse. For the Q-switched case, on a normalized scale, a higher number of atoms in the inverted population relative to the threshold the faster the pulse rise time, the narrower the width, and the higher the peak energy. As the ratio decreases the pulse shape becomes broader with lower energy concentration.

Often Q-switched laser pulses resemble a Gaussian temporal distribution, or a mixture of a Gaussian with an exponential decaying tail. As disclosed in the '759 patent, the shorter wavelength diode pumped systems are capable of producing relatively short pulses, about 10 ns, when measured at the half power points (i.e., standard definition of pulse duration) and are operated in a favorable wavelength region. Despite successful operation, applicant has found several limitations associated with the temporal pulse shape characteristic of standard diode pumped Q-switch laser systems, including the practical rise time limitations, the power distribution between the half maximum points, and the pulse decay characteristic which, when improved using the method and system of the present invention, provided noticeably better results in a metal link blowing application.

Throughout the remainder of this specification, "pulse shaping" refers to the generation of a laser pulse which is to be detected with a detector of electromagnetic radiation where "shape" refers to the power on the detector as a function of time. Furthermore, "pulse width" or "pulse duration" refers to the full width at half maximum (FWHM) unless otherwise stated. Also, Q-switched pulses collectively refers to temporal distribution of pulses obtained, for example, in standard Q-switched systems which may resemble a mixture of a substantially Gaussian central lobe with a relatively slow decaying exponential tail. These wave shapes are formally referred to as a "Q-switched pulse envelope" in laser literature. FIG. 1c shows such pulses.

In U.S. Pat. No. 5,208,437 (i.e., the '437 patent), a pulse width specification of less than 1 ns was specified for a memory repair application. Earlier work by the co-inventors of the '437 patent disclosed in "Laser Cutting of Aluminum Thin Film With No Damage to Under Layers", ANNALS OF THE CIRP, Vol 28/1, 1979, included experimental results with relatively short laser pulses having a "Gaussian" shape as defined above. The results indicated a "desired portion of the interconnection pattern" which is made of aluminum or the like, "can be cut without the layer disposed below the interconnection pattern being damaged". Specifications for the pulse width of substantially 1 ns or less with energy density of substantially $10^6 W/cm^2$ were disclosed for the apparatus. However, there was no disclosure regarding a method of temporal pulse shaping, although spatially the beam was shaped to correspond to the interconnection pattern. Furthermore, applicant's analysis on high density memory devices having multiple layers with specified pulsewidths in the ultrafast range, which is approached with the 100–300 ps used in the '437 patent, have not been satisfactory. Overcoming this limitation would presently require the ultrafast laser system to produce multiple pulses for processing each target site which would slow the laser processing rate to an unacceptable level.

Continuing to the ultrafast scale, experimental results have been disclosed for micromachining operations. The ultrafast pulses have durations on the order of fs (10–15 sec) to ps (10–12) and, at the decreased scale, exploit material properties at the atomic and molecular which are fundamentally different than found in the range of several hundred ps to ns.

In U.S. Pat. No. 5,656,186 and the publication "Ultrashort Laser Pulses tackle precision Machining", LASER FOCUS WORLD, August 1997, pages 101–118, machining operations at several wavelengths were analyzed, and machined feature sizes significantly smaller than the diffraction limited spot size of the focused beam were demonstrated.

Laser systems for ultrafast pulse generation vary in complexity and are exemplary embodiments are described in U.S. Pat. Nos. 5,920,668 and 5,400,350, and in Ultrafast Lasers Escape The Lab", PHOTONICS SPECTRA, July 1998, pp. 157–161. The embodiments generally include methods for pulse stretching of mode locked ultrafast pulses prior to amplification to avoid amplifier saturation followed by compression to extremely narrow widths. This technology holds promise for certain class of micromachining and possibly finer scale "nanomachining" operations, the latter benefit afforded by machining below diffraction limit. However, Applicant has discovered practical limitations at the present time with the available power in each pulse for applications like metal link blowing and similar micromachining applications leading to the unacceptable requirement for multiple pulses.

Applicant wishes to elaborate on the rationale for the use of a short pulse, fast rise time pulse is indicated in the following paragraphs as the reasons are manifold and a number of theoretical and empirical papers and books have been written on the subject. Ablation of metal links is taken as an example, although the principles extend to many laser processing applications where a target material is surrounded by material having substantially different optical and thermal properties. The following references 1–3 are examples:

1. John F. Ready, Effects of High Power Laser Radiation, ACADEMIC PRESS, New York 1971, pages 115–116.
2. Sidney S. Charschan, Guide for Material Processing By Lasers, Laser Institute of America, The Paul M. Harrod Company, Baltimore Md., 1977, pages 5–13.

3. Joseph Bernstein, J. H. Lee, Gang Yang, Tariq A. Dahmas, Analysis of Laser Metal-Cut Energy Process Window (to be published).

Metal Reflectivity

Metal reflectivity decreases with increased power density of a laser pulse (ref. 1). The reflectivity of a metal is directly proportional to the free electron conductivity in a material. At high electric field densities as delivered by a high intensity laser, the collision time between electrons and the lattice is reduced. This shortening of the collision time reduces the conductivity and hence the reflectivity. For example, the reflectivity of aluminum decreases from 92% to less than 25% as the laser power densities increases to the range of $10^9$ watts/cm$^2$. Hence, to circumvent the loss of laser energy to reflection it is advantageous to achieve high power density at the work piece in as short a time as possible.

Thermal Diffusivity

The distance D that heat travels during a laser pulse is proportional to the laser pulse width as follows:

$$D = \sqrt{kt}$$

where:

K is the thermal diffusivity of the material; and t is the length of the laser pulse.

Hence, it can be seen that a short laser pulse prevents heat dissipating to the substrate below the melting link and also heat conducting laterally to the material contiguous to the link. However the pulse must be long enough to heat the link material all the way through.

Thermal Stress and Link Removal

Through the absorption of the laser energy the target metal link heats up and tries to expand. However, the oxide surrounding the link contains the expanding material. Hence, stress is built up within the oxide. At some point the pressure of the expanding metal exceeds the yield point of the oxide and the oxide cracks and the metal link explodes into a fine particle vapor. The principal crack points of metal link occurs at the maximum stress points, which are at the edges of the link both top and bottom as shown in FIG. 1b.

Figure 1A:
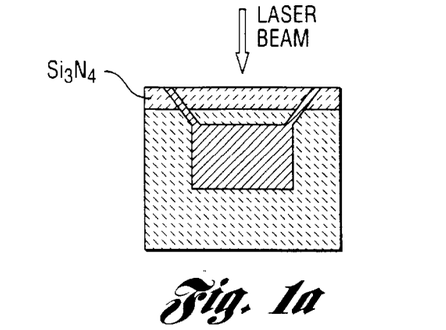
FIG. 1a shows schematically stress cracks in a top surface layer only of a semiconductor caused by expanding vaporized metal.
Figure 1B:
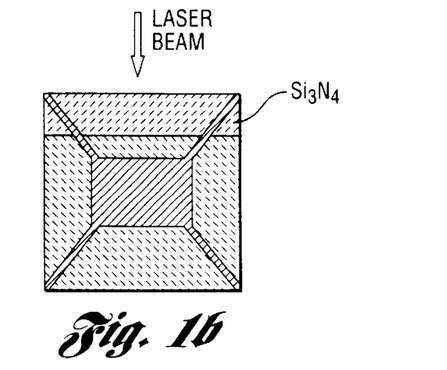
FIG. 1b shows schematically stress cracks in top and bottom layers of a semiconductor caused by expanding vaporized metal.
Figure 1C:
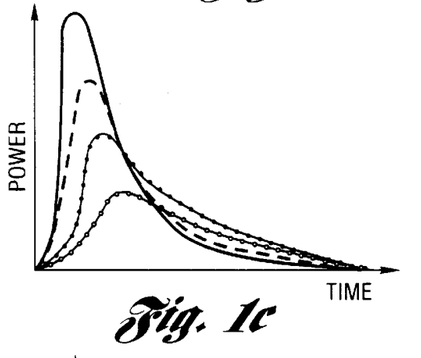
FIG. 1c shows typical prior art laser pulses resembling a Gaussian shape, or a mixture of a Gaussian with an exponential tail, referred to as a "Q-switched pulse envelope"

If the oxide over the link is somewhat thin then the cracking of the oxide will occur at the top of the link only and the oxide and link will be removed cleanly as shown in FIG. 1a. However, if the oxide is somewhat thick, cracking can occur at the bottom of the link as well as the top and the crack will propagate down to the substrate as shown in FIG. 1b. This is a highly undesirable circumstance.

Q-switched laser systems can be modified to provide short pulses of various shapes. Typical prior art lasers that produce high peak power, short pulse lasers are standard Q-switched lasers. These lasers produce a temporal pulse having a moderate pulse rise time. It is possible to change this temporal shape by using a Pockels Cell pulse slicer that switch out sections of the laser beam. In U.S. Pat. No. 4,483,005 (i.e., the '005 patent), invented by the Applicant of the present invention and having the same assignee, various methods for affecting (i.e., reducing) laser beam pulse width are disclosed. As taught in the '005 patent, which is hereby incorporated by reference, the laser pulse can be shaped somewhat to produce a "non-Gaussian" shaped beam by truncating energy outside the central lobe. It should be noted that if a relatively broad Q-switched waveform is to be transformed to a narrow, uniform shape, only a small fraction of the pulse energy will be used. For example, truncation of a Gaussian pulse to provide a sharp rise time and a narrow pulse with flatness to within 10% reduces the pulse energy by about 65%.

Figures 7, 9, 10:
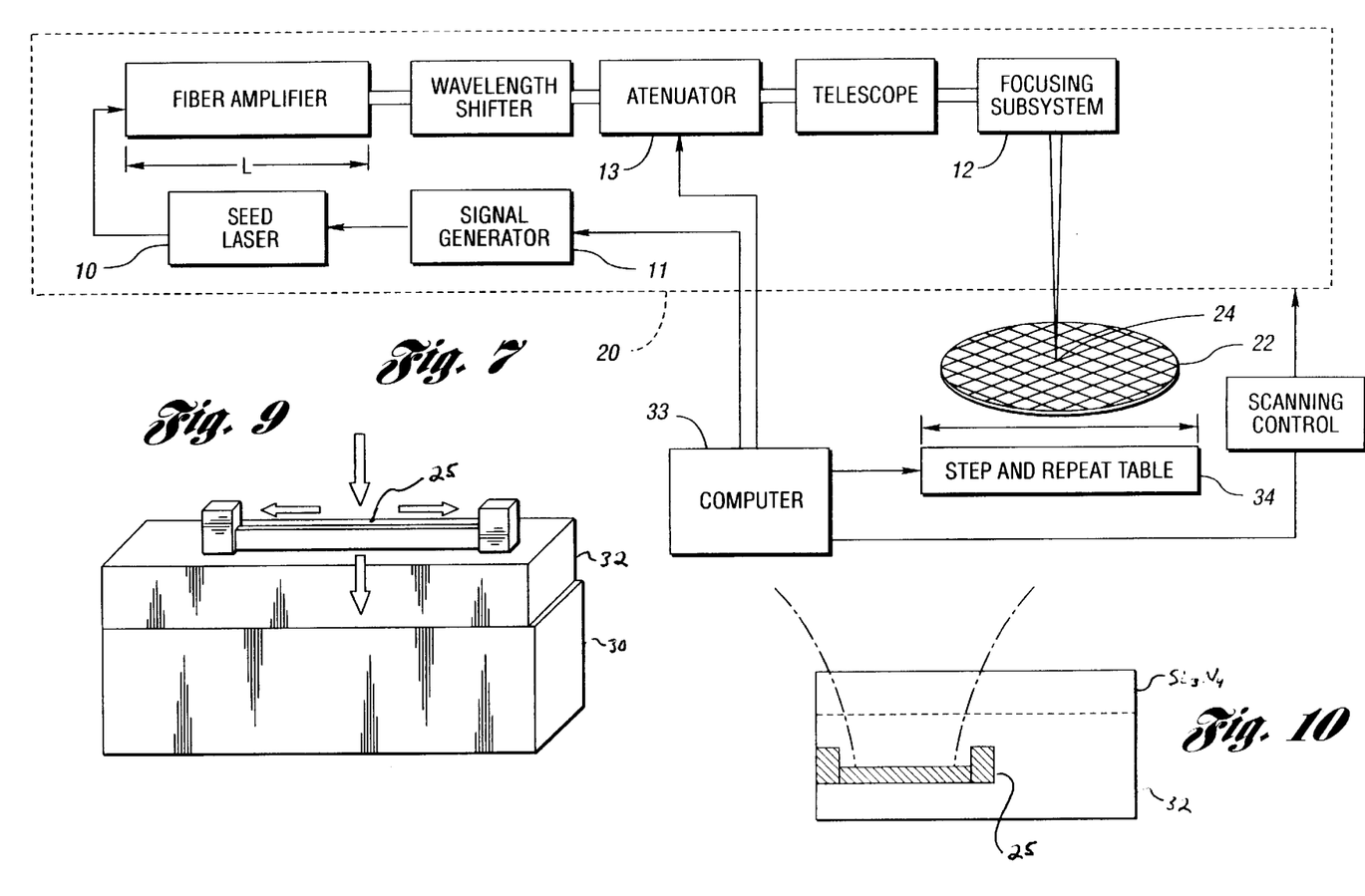
FIG. 7 is a block diagram schematic of another laser system of the present invention including a preferred attenuator and an optional shifter.
FIG. 9 shows a perspective diagrammatic view of a link of a memory on its substrate.
FIG. 10 is a drawing of a Gaussian laser beam focused onto a small spot on a focal plane containing a metal link emphasizing the microscopic size of the link compared to the diffraction-limited beam waist.
Figure 8:
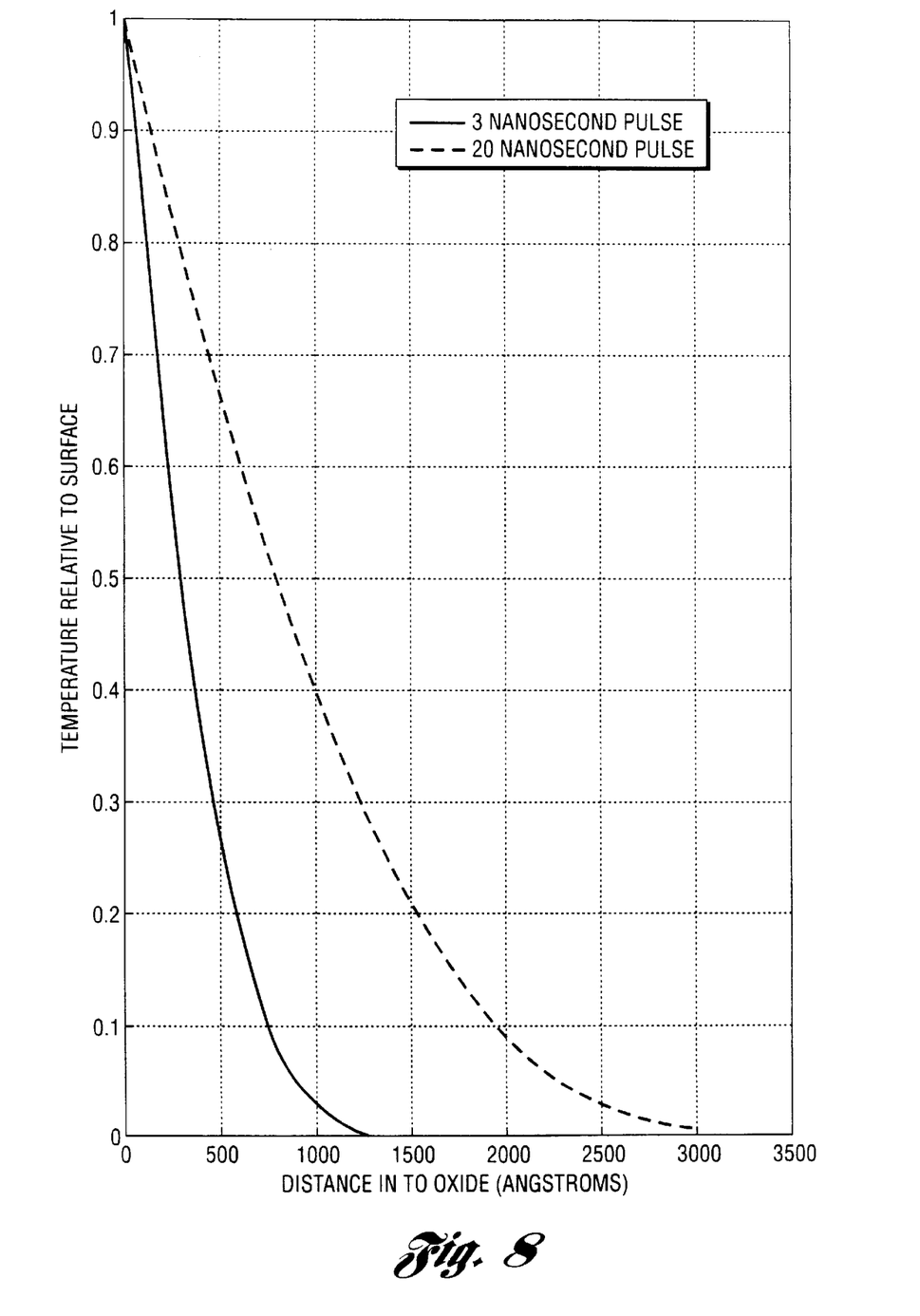
FIG. 8 is a graph of temperature at the interface between the silicon dioxide layer and the silicon substrate in FIG. 9, as a function of the thickness of the silicon dioxide layer.

Similarly, in U.S. Pat. No. 4,114,018 (the '018 patent), temporal pulse shaping to produce square pulses is disclosed. FIG. 7 shows the time interval for relatively flat laser power output. In the '018 patented method, it is necessary to remove a temporal segment of the beam intensity in order to generate the desired pulses.

A desirable improvement over the prior art would provide an efficient method for generating short pulses with high energy enclosure within the pulse duration with rapidly decaying tails. In order to accomplish this, laser technology which produces pulse shapes different than those of the Q-switched pulse envelope is preferred. Such pulses have fast rise time, uniform energy in the central lobe, and fast decay.

The fast rise-time, high power density pulse as produced by a laser other than a standard Q-switched Nd:YAG will best accomplish this task.

These benefits are implemented in a preferred manner in a system which uses laser technology departing significantly from the traditional Q-switched, solid state diode or lamp pumped, YAG technology.

Improvements over the prior art are desired with a method and system for generating pulses having a shape which is different than standard Q-switched pulses—pulses having faster rise time, relatively uniform and higher energy concentration in the central lobe, and fast fall time.

SUMMARY OF THE INVENTION

Applicant has determined that improved results can be obtained in applications of metal link blowing. For instance, a non-Gaussian, substantially rectangular pulse shape is particularly advantageous for metal link processing where an overlying insulator exists. Applicants results show that the fast rise time on the order of 1 ns, and preferably about 0.5 ns, provides a thermal shock to the overlying layer of oxide which facilitates the link blowing process. In addition, at the higher power density the reflectivity is reduced with the fast rising short pulse. A pulse duration of about 5 ns with a substantially uniform pulse shape allows more energy to be coupled to the link leading to a reduced energy requirement for link removal. Rapid fall time of about 2 ns is important to eliminate the possibility of substrate damage. Furthermore, an advantage of a nearly square power density pulse in time is that the power density is the highest when it is needed and the pulse is off when it is not.

A short fast rising pulse will allow the top of the link to melt and expand first before the heat can diffuse down to the lower portion of the link. Hence, stress is built up in the top of the link and promotes cracking of the top layer without generating a crack down to the substrate.

It is an object of this invention to provide a compact, gain switched laser system which has the capability for generating sub-nanosecond rise time pulses having short duration of a few nanoseconds and rapid fall time. State of the art fast pulse systems incorporate gain switched technology, in which a low power semiconductor seed laser is rapidly and directly modulated to produce a controlled pulse shape which is subsequently amplified with a laser amplifier, such as a cladding pumped fiber optic system with a high power laser diode or diode array used as the pump laser. Such laser systems are described in U.S. Pat. No. 5,694,408 and PCT Application No. PCT/U.S98/42050, and are "building blocks" of certain ultra-fast chirped pulse amplifier systems, for instance the system described in U.S. Pat. No. 5,400,350.

It is a general object of the invention to improve upon prior art laser processing methods and systems, particularly those where the optical and/or thermal properties of a region near the target material differ substantially.

It is a general object of the invention to provide laser pulse shaping capability for micromachining and laser material processing applications, for instance laser ablation of links or other interconnects on semiconductor memories, trimming, drilling, marking, and micromachining. A predetermined waveform shape is generated from a gain-switched laser which is different than that of the standard Q-switched systems.

It is an object of the invention to provide improvements and margin for semiconductor processing, for example, 16–256 megabit semiconductor repair, which results in clean processing of microstructures without the risk of later device failure due to conductive residue or contamination near the ablation site.

It is an object of the invention to provide a pulse waveform rise time in as short as a few hundred picoseconds, the pulse duration typically less than about 10 nanoseconds with rapid pulse decay, thereby providing laser processing of a target structure at high power density, whereby damage arising from thermal shock and diffusion in the surrounding regions is minimized.

It is an object of the invention to prevent damage to the structures surrounding and beneath the target material in semiconductor laser processing applications by achieving high power density at the workpiece in a very short time with a high power, fast rise time pulse at any wavelength suitable for the laser ablation process thereby improving the process window in a semiconductor material processing application.

It is an object of the invention to process a target site with a single laser processing pulse with rise time fast enough and with sufficient power density so as to provide a reduction in the reflectivity of a metal target structure, such a single metal link on a semiconductor memory, and hence provide more efficient coupling of the laser energy. The fast rising laser pulse is of sufficient pulse duration to efficiently heat and vaporize the material of each metallic target structure with relatively uniform power density during the ablation period, yet a rapid pulse fall time after the target material is vaporized avoids damage to surrounding and underlying structures.

Figure 2:
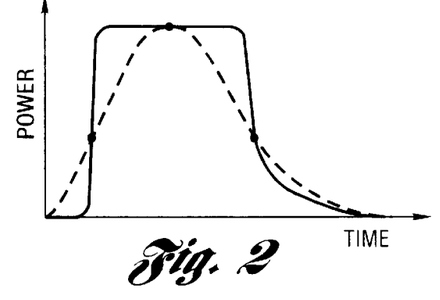
FIG. 2 shows the preferred pulse shape of the present invention for processing metal links when compared to a Q-switched of the same total energy.

It is an object of the invention to provide superior performance in semiconductor metal link blowing applications when compared to systems utilizing standard Q-switched lasers, such lasers having typical pulse rise times of several nanoseconds and represented by a Q-switched pulse envelope. A laser pulse is generated to provide a substantially square pulse shape with pulse duration in the range of about 2–10 nanoseconds and a rise time of about 1 ns and preferably about 0.4 ns. Additionally, the pulse decay is to be rapid when switched off thereby allowing only a very small fraction of pulse energy to remain after the predetermined pulse duration, the pulse "tails" rapidly decaying to a sufficiently low level so as to avoid the possibility of damaging the underlying substrate or other non-target materials. A comparison of these pulses is illustrated in FIG. 2.

It is an object of the invention to expand the processing window of a semiconductor laser ablation process to provide rapid and efficient ablation of microscopic structures surrounded by materials having different optical and thermal properties. Such structures are typically arranged in a manner where the width and spacing between the structures is about 1 micron or smaller and stacked in depth. The application of a short laser pulse cleanly ablates the target material, yet damage to surrounding materials caused by heat dissipation in either the lateral direction or damage to the underlying substrate below the target material is prevented.

It is an object the invention to controllably machine a material having substantially homogeneous optical and thermal properties with the application of a short pulse having high energy density, the pulse duration being a few nanoseconds in the material processing range where a fluence threshold is approximately proportional to the square root of laser pulse width.

In carrying out the above objects and other objects of the present invention, an energy-efficient, laser-based method for processing target material having a specified dimension in a microscopic region without causing undesirable changes in electrical or physical characteristics of material surrounding the target material is provided. The method includes generating a laser pulse train utilizing a laser having a wavelength at a repetition rate wherein each of the pulses of the pulse train has a predetermined shape. The method then includes optically amplifying the pulse train without significantly changing the predetermined shape of the pulses to obtain an amplified pulse train. Each of the amplified pulses has a substantially square temporal power density distribution, a sharp rise time, a pulse duration and a fall time. The method also includes delivering and focusing at least a portion of the amplified pulse train into a spot on the target material wherein the rise time is fast enough to efficiently couple laser energy to the target material, the pulse duration is sufficient to process the target material and the fall time is rapid enough to prevent the undesirable changes to the material surrounding the target material.

The target material may include microstructures such as conductive lines or links, the latter being common circuit elements of redundant semiconductor memories. The conductive lines may be metal lines and wherein the pulse duration is sufficient to effectively heat and vaporize the metal lines, or a specified portion thereof.

The target material may be a part of a semiconductor device such as a semiconductor memory having 16–256 megabits.

At least a portion of the material surrounding the target material may be a substrate such as a semiconductor substrate.

The target material may be part of a microelectronic device.

The substantially square temporal power density distribution is sufficient to substantially completely ablate the target material.

Preferably, the rise time is less than 1 nanosecond and, even more preferably, is less than 0.5 nanoseconds.

Preferably, the pulse duration is less than 10 nanoseconds and, even more preferably, is less than 5 nanoseconds.

Also, preferably, the fall time is less than 2 nanoseconds.

A single amplified pulse is typically sufficient to process the target material.

The target material may have a reflectivity to the amplified pulses and wherein the power density of the amplified pulses is sufficiently high to reduce the reflectivity of the target material to the amplified pulses and to provide efficient coupling of the laser energy to the target material.

Preferably, each amplified pulse has a relatively uniform power density distribution throughout the pulse duration.

Preferably, each pulse has a temporal power density distribution uniform to within ten percent during the pulse duration.

The material surrounding the target material may have optical properties, including absorption and polarization sensitivity, and thermal diffusivity properties different from the corresponding properties of the target material.

Preferably, the repetition rate is at least 1000 pulses/second and each of the amplified pulses has at least 0.1 and up to 3 microjoules of energy.

Preferably, the step of optically amplifying provides a gain of at least 20 DB.

Also, preferably, both the rise time and the fall time are less than one-half of the pulse duration and wherein peak power of each amplified pulse is substantially constant between the rise and fall times.

Preferably, each of the amplified pulses has a tail and the method also includes attenuating laser energy in the tails of the amplified pulses to reduce fall time of the amplified pulses while substantially maintaining the amount of power of the pulses.

Still further in carrying out the above objects and other objects of the present invention, an energy-efficient system for processing target material having a specified dimension in a microscopic region without causing undesirable changes in electrical or physical characteristics of material surrounding the target material is provided. The system includes a controller for generating a processing control signal and a signal generator for generating a modulated drive waveform based on the processing control signal. The waveform has a sub-nanosecond rise time. The system also includes a gain-switched, pulsed seed laser having a wavelength for generating a laser pulse train at a repetition rate. The drive waveform pumps the laser so that each pulse of the pulse train has a predetermined shape. Further, the system includes a laser amplifier for optically amplifying the pulse train to obtain an amplified pulse train without significantly changing the predetermined shape of the pulses. Each of the amplified pulses has a substantially square temporal power density distribution, a sharp rise time, a pulse duration and a fall time. The system further includes a beam delivery and focusing subsystem for delivering and focusing at least a portion of the amplified pulse train onto the target material. The rise time is fast enough to efficiently couple laser energy to the target material, the pulse duration is sufficient to process the target material, and the fall time is rapid enough to prevent the undesirable changes to the material surrounding the target material.

The laser amplifier preferably includes an optical fiber and a pump such as a laser diode to pump the optical fiber wherein the pump is distinct from the seed laser.

The laser diode pump source may also be gain switched (pulsed and directly modulated) to increase diode lifetime by switching to the "off" state during extended periods where laser processing is not occurring.

Preferably, the seed laser includes a laser diode.

The system may include an attenuator for attenuating laser energy in the tails of the amplified pulses to reduce fall time of the amplified pulses while substantially maintaining the amount of energy of the pulses.

The pulse duration may be chosen as a function of a specified target material dimension. The specified material dimension may be less than the laser wavelength. The preferred laser is a high speed, semiconductor laser having a wavelength less than about 2 $\mu$m. Future material advances in semiconductor laser diode technology and fiber materials may provide for operation in the visible region as well as at longer infrared wavelengths.

The seed laser diode may be a multimode diode laser or a single frequency (single mode) laser utilizing a distributed Bragg reflector (DBR), distributed feedback (DFB), or an external cavity design.

The spot size typically has a dimension in the range of about 1 $\mu$m–4 $\mu$m.

The density of the memory may be at least 16–256 megabits.

The semiconductor device may be a microelectromechanical device.

Preferably, the attenuated laser energy in the pulse tail is attenuated by at least 10 dB within 1.5 times the pulse duration.

Yet still further in carrying out the above objects and other objects of the present invention, an energy-efficient, laser-based method for ablating a metal link having a specified dimension embedded in at least one passivation layer without causing undesirable changes in electrical or physical characteristics of the at least one passivation layer surrounding the metal link is provided. The method includes generating a laser pulse train utilizing a laser having a wavelength at a repetition rate. Each of the pulses of the pulse train has a predetermined shape. The method also includes optically amplifying the pulse train without significantly changing the predetermined shape of the pulses to obtain an amplified pulse train. Each of the amplified pulses has a substantially square temporal power density distribution, a sharp rise time, a pulse duration and a fall time. The method further includes delivering and focusing at least a portion of the amplified pulse train into a spot on the metal link. The rise time is fast enough to efficiently couple laser energy to the metal link. The pulse duration is sufficient to ablate the metal link and the fall time is rapid enough to prevent the undesirable changes to the at least one passivation layer surrounding the metal link.

Still further in carrying out the above objects and other objects of the present invention, an energy-efficient system for ablating a metal link having a specified dimension embedded in at least one passivation layer without causing undesirable changes in electrical or physical characteristics of the at least one passivation layer surrounding the metal link is provided. The system includes a controller for generating a processing control signal and a signal generator for generating a modulated drive waveform based on the processing control signal. The waveform has a sub-nanosecond rise time. The system also includes a gain-switched, pulsed seed laser having a wavelength for generating a laser pulse train at a repetition rate. The drive waveform pumps the laser so that each pulse of the pulse train has a predetermined shape. Further, the system includes a laser amplifier for optically amplifying the pulse train without significantly changing the predetermined shape of the pulses to obtain an amplified pulse train. Each of the amplified pulses has a substantially square temporal power density distribution, a sharp rise time, a pulse duration and a fall time. The system further includes a beam delivery and focusing subsystem for delivering and focusing at least a portion of the amplified pulse train into a spot on the metal link. The rise time is fast enough to efficiently couple laser energy to the metal link. The pulse duration is sufficient to ablate the metal link, and the fall time is rapid enough to prevent the undesirable changes to the at least one passivation layer surrounding the metal link.

The metal link may be embedded in a top passivation layer thereover and a bottom passivation layer thereunder. The pulse duration is sufficient to crack the top passivation layer but not the bottom passivation layer.

In carrying out the above objects and other objects of the invention a method is provided to ablate target material using a laser having a wavelength suitable for laser material processing while avoiding damage to surrounding materials. The method includes the steps of modulating a laser beam to produce a predetermined gain-switched pulse and focusing the laser beam onto the target region. The predetermined gain-switched pulse shape includes a rise time of the laser pulse fast enough to efficiently couple laser energy to a target structure, with a pulse duration of sufficient length to efficiently heat and vaporize the target material, and a pulse decay time which is rapid enough to avoid damage of structures surrounding the target material.

Further in carrying out the above objects and other objects of the invention a system for is provided to ablate material using a laser having a wavelength suitable for laser processing while avoiding damage to surrounding materials. The system includes a laser source, components to modulate the laser source to generate a laser pulse having a predetermined gain-switched pulse shape, and optical components for focusing the laser beam onto the target region. The predetermined pulse shape includes an optical rise time of the laser pulse fast enough to efficiently couple laser energy to a target structure, with a pulse duration of sufficient length to efficiently heat and vaporize the target material, and a pulse decay time which is rapid enough to avoid damage of structures surrounding the target material.

In a preferred construction of the invention, the gain-switched pulse shape includes a fast rise time pulse, substantially flat at the top, with a fast pulse fall time. A "seed" laser diode is directly modulated to generate a predetermined pulse shape. The optical power is increased through amplification with a fiber laser amplifier to output power levels sufficient for laser processing. The resulting gain-switched pulse at the fiber laser amplifier output is focused onto the target region.

In a construction of the invention, it can be advantageous to directly modulate the "seed" diode to produce a predetermined gain-switched square pulse and provide low distortion amplification using a fiber laser amplifier to provide output pulse levels sufficient for material processing.

In an alternative construction, the pulse temporal power distribution of the directly modulated seed diode is modified to compensate for distortion or non-uniformity of the fiber amplifier or other components, for instance the "smooth" rise of an output modulator. The resulting laser processing pulse which is focused into the target region will have a desired shape: fast rise time, relatively flat during the pulse duration, with rapid decay.

In a construction of the invention it can be advantageous to enhance the performance of the laser processing system by providing a "pulse slicing" module which is used to attenuate laser energy remaining at the output of the laser processing system when the "seed" laser pulse is terminated, thereby preventing heating of sensitive structures not designated as target material after processing is complete. The "pulse slicing" technique is useful to attenuate the tail of either a modified pulse or a standard Q-switched pulse. This is illustrated in FIGS. 4a and 4b, wherein a log scale is provided in the vertical axis of FIG. 4b.

It is preferred to perform laser processing operations, particularly metal link blowing, at pulse rates of at least 1 KHz (1000 pulses/second) with laser pulse energy of at least 0.1 microjoules in a pulse, the 0.1 microjoules being emitted at the output of the fiber amplifier, where the fiber optic amplifier gain is at least 20 DB (1000:1).

In a construction of the invention, a laser pulse is shaped having a rise and fall time shorter than about one-half of the pulse duration and where the peak power is approximately constant between the rise and fall time.

Figures 3A, 3B, 4A, 4B:
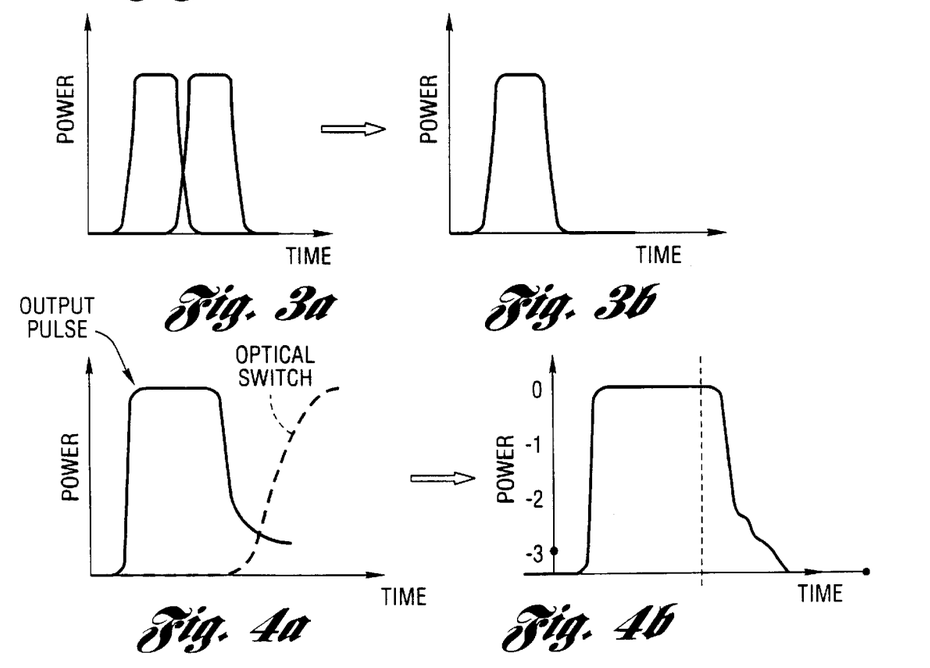
FIGS. 3a and 3b show a method of combining two short pulses closely spaced in time to create a modified pulse.
FIGS. 4a and 4b show the result of "pulse slicing" for improving the pulse energy enclosure of a general pulse shape.

In a construction of the invention, it is possible to generate a series of closely-spaced, short pulses which, when combined, produce a desired pulse shape as illustrated in FIGS. 3a and 3b.

In a construction of a system using the invention it can also be advantageous to operate the laser at pulse repetition rates exceeding the material processing rate and utilize a computer controlled optical switch to select processing pulses, the computer being operatively connected to a beam positioning system used to position a focused laser beam for material processing.

The above objects and other objects, features, and advantages of the present invention are readily apparent from the following detailed description of the best mode for carrying out the invention when taken in connection with the accompanying drawings.

BEST MODE FOR CARRYING OUT THE INVENTION

Laser Processing System Architecture

Those skilled in the art can appreciate that the following embodiment can be applied to several applications in micromachining and laser processing with appropriate adjustments to parameters like laser power, energy density, spot size, wavelength, pulse width, polarization and repetition rate. The specific application to metal link blowing is described for illustrative purposes.

In a preferred embodiment of FIG. 7, a seed laser 10 and a fiber amplifier are mounted on a stable platform attached to the motion system 20 and the workpiece. It is very important in removing links that the beam be positioned with accuracy of less than 3/10 of a micron. The timing of the laser pulse to correlate with the relative positions of the target and optical system is important because of the continuous motion required in order to obtain high processing speeds.

The laser 10 is externally controlled by the computer 33 and a signal generator 11 and transmits its modulated beam to a focusing subsystem 12 comprising high numerical aperture optics and which may further comprise a beam deflector, for instance a galvonometer mirror controlled by a scanner control via the computer 33. The system control computer 33 is also operatively connected to a positioning mechanism or motion system 20 for the system and the signal generator 11 to properly time the pulse generation. The laser beam must be precisely controlled so as to produce a sharply focused beam, with a spot size in the range of about 1.5–4 microns, at the correct location in X, Y and Z. As such, those skilled in the art of beam positioning and focusing will recognize the importance of optics corrected to provide near diffraction and limited performance and precision motion control of the laser head or target substrate. Depending upon the specific laser processing application requirements, it may be advantageous to provide an optical system with a relatively narrow field of view to provide diffraction limited focusing and precision X, Y-motion stages for beam positioning. Furthermore, various combinations of mirror motion for rapid deflection in combination with translation stages are viable.

A step and repeat table 34 can also be used to move a wafer 22 into position to treat each memory die 24 thereof. Those skilled in the art of beam scanning will appreciate the advantages of a mirror-based, beam deflection system, but, as noted above, substitution of other position mechanisms such as X, Y translation stages for movement of the substrate and/or laser head are viable alternatives for practicing the invention. For example, the substrate positioning mechanism 34 may comprise very precise (well below 1 micron) X, Y, Z positioning mechanisms operating over a limited range of travel. The positioning mechanism 20 may be used to translate the laser processing optical system components, including the laser, fiber amplifier, and focusing subsystem in a coarser fashion. Further details on a preferred positioning system are disclosed in the above-noted pending U.S. patent application entitled "High Speed Precision Positioning Apparatus", Ser. No. 09/156,895, filed Sep. 18, 1998.

A system optical switch 13 in the form of a further acousto-optic attenuator or pockels cell is positioned beyond the laser cavity, in the laser output beam. Under control of the computer 33, it serves both to prevent the beam from reaching the focusing system except when desired, and, when the processing beam is required, to controllably reduce the power of the laser beam to the desired power level. During vaporization procedures this power level may be as little as 10 percent of the gross laser output, depending upon operating parameters of the system and process. The power level may be about 0.1 percent of the gross laser output during alignment procedures in which the laser output beam is aligned with the target structure prior to a vaporization procedure. The acousto-optic device is generally preferred because of the ease of use, although the delay of the pockels cell is considerably less.

In operation, the positions of the wafer 22 (or target or substrate) are controlled by the computer 33. Typically, the relative movement is at substantially constant speed over the memory device 24 on the silicon wafer 22, but step and repeat motion of the wafer is possible. The laser 10 is controlled by timing signals based on the timing signals that control the motion system. The laser 10 typically operates at a constant repetition rate and is synchronized to the positioning system by the system optical switch 13.

In the system block diagram of FIG. 7, the laser beam is shown focused upon the wafer 22. In the magnified view of FIG. 9, the laser beam is seen being focused on a link element 25 of a memory circuit or device 24.

For processing fine link structures, spot size requirements are becoming increasingly demanding. The spot size requirement is typically 1.5–4 microns in diameter, with peak power occurring in the center of the spot with good conformance to a Gaussian distribution, and with lower power occurring at the edges. Excellent beam quality is needed, approaching diffraction limit, with a beam quality or "m-squared factor" of about 1.1 times or better typical. This "times diffraction limit" quality standard is well known to those skilled in the art of laser beam analysis. Low sidelobes are also preferred to avoid optical crosstalk and the undesirable illumination of features outside the target region.

The link 25 is somewhat smaller than the spot size, thereby mandating precision positioning and good spot quality. A link may be, for instance, 1 micron wide and about 1/3 micron thick. In the case demonstrated here, the link is made of metal, and a lateral dimension (width) and thickness are smaller than the laser wavelength.

Laser System—Preferred

Figure 5:
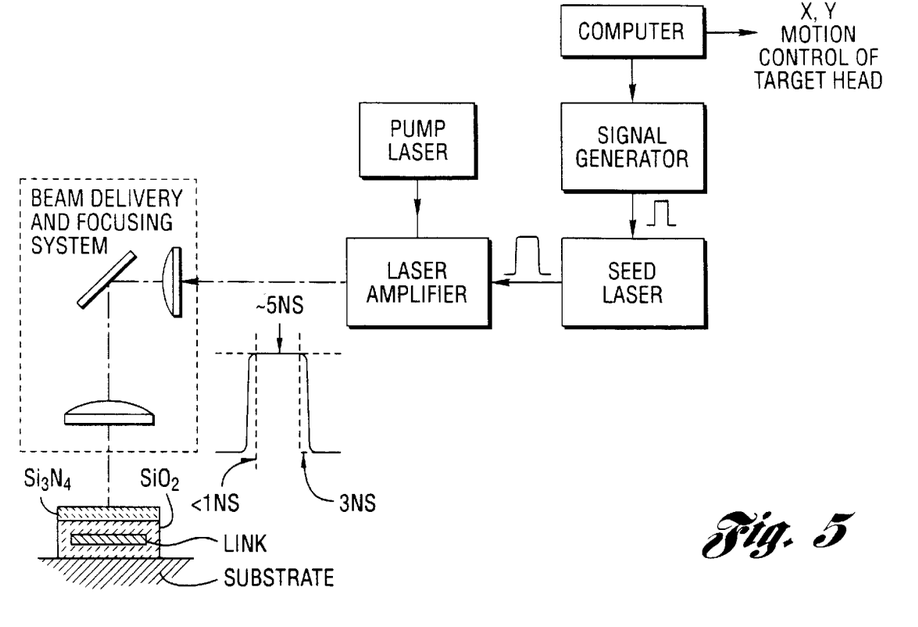
FIG. 5 is a general block diagram of a preferred laser system for laser material processing.

In a preferred embodiment a laser subsystem of FIG. 5 utilizes a master oscillator, power amplifier (MOPA) configuration. This system produces a laser pulse that seeds an amplifier to produce a high power short rise time pulse. A seed laser is the key to producing the fast rise time, short pulse but at very low energy levels. The system requires a laser amplifier to produce enough energy to do material processing. A fiber laser amplifier and a high-speed infrared laser diode having an output wavelength suitable for a laser processing application is preferred. With such a system a laser can be devised that produces a laser pulse of the preferred shape and speed as shown in the lower part of FIG. 5. That is, a fast rise time pulse, square at the top and a fast fall time. This pulse shape, in turn, provides the desired laser-material interaction results of reduction in metal reflectivity, low diffusion of the energy into the device and cracking of the top oxide without damage to the lower oxide.

The MOPA configuration is relatively new and pulsed versions are regarded as state of the art. The laser diode which has sub-nanosecond rise time in response to a modulating drive waveform is a starting point in the fiber laser MOPA configuration, with the laser diode as a gain element. The laser diode generally has multiple longitudinal modes and the sub-system can be configured for single mode operation or otherwise tuned with bulk components at the output or, alternatively, with integrated fiber gratings in the system.

Figure 6A:
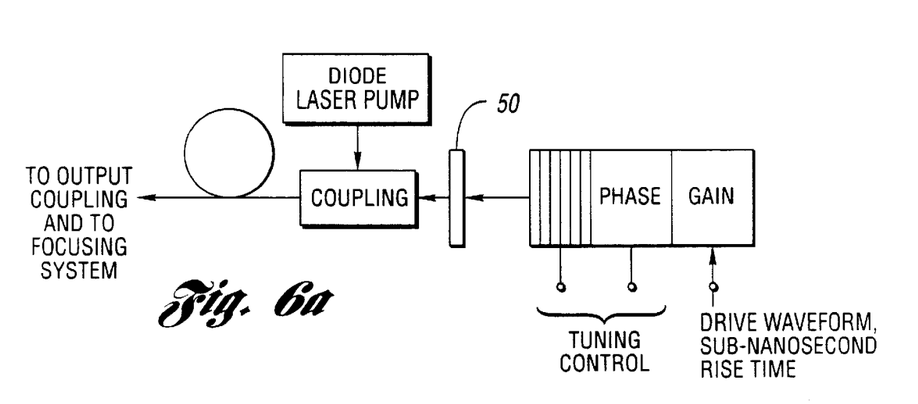
FIG. 6a is a schematic diagram of one type of a MOPA laser system with a distributed Bragg laser as the semiconductor seed laser; this is a single mode laser and a fiber optic amplifier producing the preferred pulse shape.
Figure 6B:
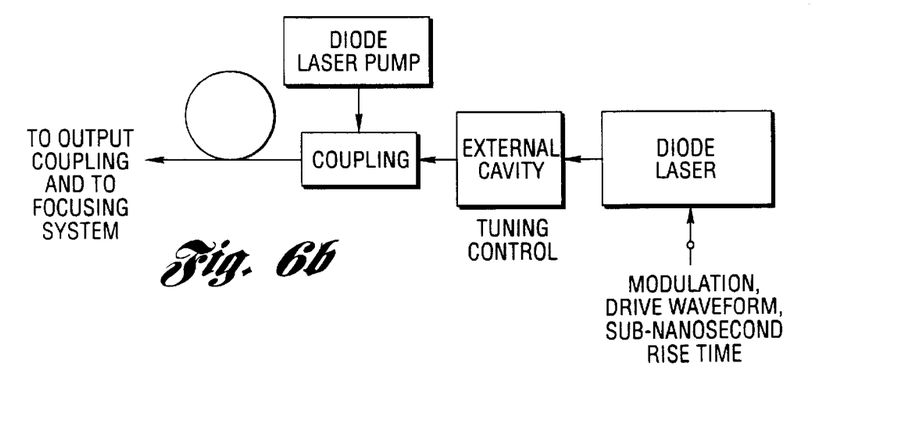
FIG. 6b is a schematic diagram of a single frequency laser with external cavity tuning and a fiber optic amplifier.

For instance, the Littman-Metcalf grating configuration described in product literature by New Focus Inc., in the external cavity configuration, is a viable configuration. FIG. 6b shows a schematic of a single frequency laser with external cavity tuning and also includes an optical fiber pumped at its cladding by diode laser pump.

Other diode laser alternatives include distributed feedback lasers (DFB) and distributed Bragg lasers (DBL) which have integrated gratings and waveguide structures, some cases with external controls allowing the user to independently control the gain, phase, and grating filter. See FIG. 6a for a DBL configuration including a coupler 50. This provides flexible mode selection and tuning capability. The laser frequencies can be dynamically selected with a number of the configurations by adjustments of the bulk components, such as the grating and/or mirrors of the external cavity, or, alternatively, a fixed wavelength or mode chosen. The range over which the diode central wavelength can be selected is impressive overall, from less than 1 $\mu$m to about 1.3–1.5 $\mu$m or longer, the latter wavelengths corresponding to those used for fiber optic communication.

In any case, a key element for the purpose of this invention, at a laser wavelength selected for material processing, is the rise time of the "seed" laser diode and the pulse shape. Also, a consideration for this invention is that the seed laser wavelength be matched to the spectral band over which the fiber optic amplifier has high gain with little sensitivity to small wavelength changes—i.e., in the amplifier "flat" response region for maintaining excellent pulse-to-pulse power output with sufficient power. For Ytterbium-doped fibers, the gain is high in about a reasonably broad wavelength band near the 1.1 $\mu$m absorption edge of silicon. Further development in materials or integrated fiber components may extend the useful wavelength regions providing more flexibility in matching the fiber emission spectrum, the seed laser wavelength and target material properties. For example, in *Photonics Spectra*, August 1997, p. 92, the results are reported for a state-of-the-art fiber laser development over a wavelength range of 1.1 $\mu$m to 1.7 $\mu$m.

The operation of a Raman shifter was described in the above-noted '759 patent with the specific use with a short pulse Q-switched system. If desired this device could also be placed at the output of the fiber system to shift the output wavelength to a desirable region to improve absorption contrast, for example. Recognizing the importance of pulse width and small spot size requirements for processing, as taught in the above-noted '759 patent, typical operation of the preferred system for metal link processing will be in the range of about 1.06 $\mu$m or beyond, with a 1.08 $\mu$m wavelength, for example.

The output of the seed laser is to be amplified for laser material processing. The preferred fiber optic laser amplifier will provide gain of about 30 db. The seed laser output is coupled to the core of the fiber laser either directly or with bulk optics which splits the beam for fiber delivery. Both techniques are routinely practiced by those skilled in the art of ultrafast lasers using chirped pulse amplification, but the system of the preferred embodiment is overall much less complex than such ultrafast systems. In the system of the present invention, the seed pulse is amplified and no optics for pulse stretching and compression are required. The fiber used in the amplifier system is cladding pumped with a diode laser having a substantially different wavelength than the seed laser, for example 980 nm, which allows for optical isolation of the seed and pumping beams with a dichroic mirror in the bulk optical system arrangement. From the standpoint of cost, size, and ease of alignment, the preferred arrangement utilizes a coupling arrangement where the seed laser is directly coupled to the fiber amplifier. The pump laser injects the high power diode energy, say at 980 nm wavelength, into the cladding structure of a rare earth Ytterbium (Yb)-doped fiber using coupling techniques familiar to those skilled in the art of fiber laser system design.

Low distortion is an important characteristic of the fiber amplifier. Low distortion allows the output pulse shape to substantially match the seed laser pulse shape or possibly further enhance the pulse edges or uniform power shape. The fiber optic gain medium produces the amplifier pulse of FIG. 5 which is delivered to the optical system and focused onto the object.

Multiple fiber amplifiers can be cascaded for further gain if desired, provided the distortion is low. It could be advantageous to provide active optical switches or passive optical isolators at the output of intermediate stages to suppress spontaneous emission. These techniques are known by those skilled in the art and are disclosed in U.S. Pat. No. 5,400,350 and WO 98/92050, for example.

In some cases it may be desirable to further improve the pulse shape by reducing the "tails" with a pulse slicer added to the laser sub-system. This may be in the form of an electro optic device such as a pockels cell or preferably a low delay acousto-optic modulator. This technique can suppress energy in the pulse tails to negligible levels whenever the risk of damage occurs at a small multiple of the "pulse duration" of the processing pulse. For example, if the energy is reduced by 20 dB (100:1) within 1.5 times the predetermined pulse duration, there will be for all practical purposes no risk of substrate damage in metal link blowing applications. To be more specific, if a pulse duration of 8 ns is chosen for a square pulse shape in a metal link blowing application and the energy is 20 dB down at 12 ns, the remaining energy is far below that which would cause damage to the Si substrate, this damage being substantial at about 18 ns or more after application of the laser pulse. In a preferred mode of operation, the low delay, high bandwidth pulse slicer will be activated near the end of the amplifier pulse duration and will have a multiplicative effect on the pulse tail, with minimal distortion of the central lobe. Any effects of the amplifier distortion and the "turn on delay" of the modulator can be compensated to some degree by changing the shape of the seed diode laser waveform during the pulse duration. The resulting temporal pulse shape in the focused beam is compensated and is of the desired square shape.

Also, presently fiber systems operate optimally at pulse repetition rates of about 20 KHz which is somewhat faster than the processing rate. An output optical switch, for example a low delay acousto-optic modulator, with its driver operatively connected to a computer, select pulses for processing. In this way the reliability of the fiber amplifier and hence the processing system is high. Those skilled in the art will recognize that it would be advantageous from an economical standpoint to combine the pulse slicer and output optical switch into a single module.

Laser System—Alternative

There are numerous advantages cited above of the preferred system of the seed laser and fiber amplifier. Current modulation of the laser diode with an appropriate driver can directly produce a desired gain-switched pulse shape which is amplified by the fiber laser amplifier with low distortion. The method is contemplated as the best and most efficient approach to practicing the present invention. However, those skilled in the art of laser pulse generation and shaping will recognize that other less efficient approaches can be used. For example, modifications of Q-switched systems extending beyond the teachings of U.S. Pat. No. 4,483,005 are possible to obtain relatively flat pulses by using various control functions to drive a pockels cell or optical switches provided that the modulator response time is fast enough. Modern techniques for effecting pulse width include the use of modified output couplers, for instance, replacing conventional glass in Nd:YAG Q-switched lasers with GaAs, in either bulk or crystal form. Q-switched pules of duration from several picoseconds to a few nanoseconds have been reported in passive Q-switching of an Nd:YAG laser with a GaAs output coupler, OPTICAL ENGINEERING, 38(11), 1785–88, November 1999.

Laser Processing Steps And Results

The metal link 25 is supported on the silicon substrate 30 by silicon dioxide insulator layer 32, which may be, e.g., 0.3–0.5 microns thick. The silicon dioxide extends over the link, and often an additional insulating layer of silicon nitride is present over the $SiO_2$ layer. In the link blowing technique, the laser beam impinges on each link and heats it to the melting point. During the heating, the metal is prevented from vaporizing by the confining effect of the overlying passivation layers. During the duration of the short pulse, the laser beam progressively heats the metal, until the metal so expands that the insulator material ruptures. At this point, the molten material is under such high pressure that it instantly vaporizes and blows cleanly out through the rupture hole.

As disclosed in the above-noted '759 patent, with the very small spot size used with small metal links, the heat may be considered to spread in essentially an exponential gradient by conduction from the portion of the beam striking the target. By employing a peak beam power so high that sufficient energy for evaporation of the link is delivered in a pulse of 8 nanoseconds, and preferably substantially less, the conductive component of heat transfer can be substantially confined to a metal link and the underlying oxide layer, despite its being very thin, such that the temperature rise in the silicon attributable to conduction and the temperature rise attributable to absorption of the beam in silicon, can cumulatively be kept below the temperature threshold at which unacceptable silicon damage occurs.

Furthermore, the above-noted '759 patent teaches several important aspects related to the thermal transfer characteristics of the link and adjacent structures. A thermal model predicts that narrow pulse widths, 3–10 ns, for example, which in turn are dependent upon the thickness of the target materials, are preferred to avoid heat conduction and subsequent damage to the Si substrate for representative dimensions. However, it is critically important to realize that other structures adjoining the link can also affect the quality of laser processing results, as the following experimental results indicate.

The benefits of the gain-switched, square pulse shape were verified with both experimental results on and through computer simulation (finite element analysis). Specifications for the laser used for link blowing were:

| Laser wavelength | 1.083 microns |
|---|---|
| Maximum Laser energy | 10 microjoules |
| Pulse width | 7 ns (FWHM, square pulse) |
| Repetition rate | 10 KHz (70 KHz laser rate) |

-continued

| Spatial profile | Gaussian, TEM-OO, $M^2$ = 1.02 (times diffraction limit) |
|---|---|
| Polarization | Unpolarized |
| Pulse Rise Time | ~.5 ns |

The laser of choice was a Ytterbium, cladding pumped fiber laser, in the MOPA configuration using a 980 nm pump diode and a 7 micron diameter single mode fiber.

Experimental results with the laser specified above on recent generation memory devices demonstrated superior performance when compared to the standard Q-switched laser systems. The results led to a conclusion that the short, fast rising pulse of the MOPA laser accounted for the superior performance. As disclosed earlier, the reasons are threefold:

1. The 1.083 wavelength is long enough to avoid substrate damage—about 10 times less absorption occurs at 1.083 $\mu$m compared to the 1.047 $\mu$m wavelength.
2. The fast rising pulse provides a thermal shock to the overlying layer of oxide which facilitates link removal.
3. The high power density of the fast rising pulse reduces the link reflectivity which allows for efficient energy coupling.

Figure 11A:
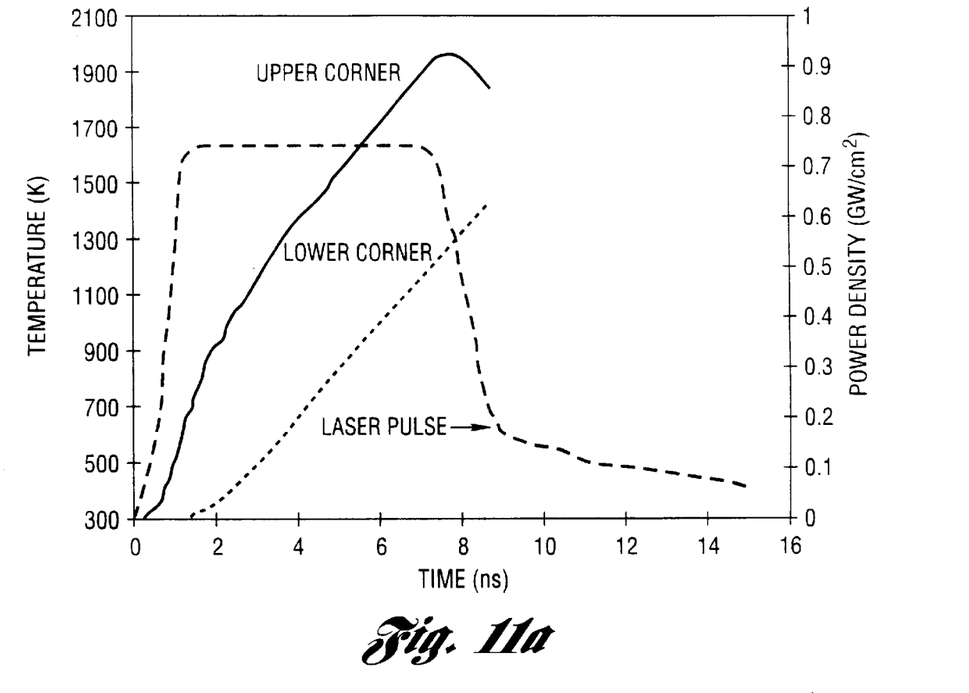
FIGS. 11a and 11b are graphs which show the results of a computer finite element analysis simulation where the time history of stress and temperature is plotted in the graphs for a Q-switched pulse and square pulse used for metal link processing.
Figure 11B:
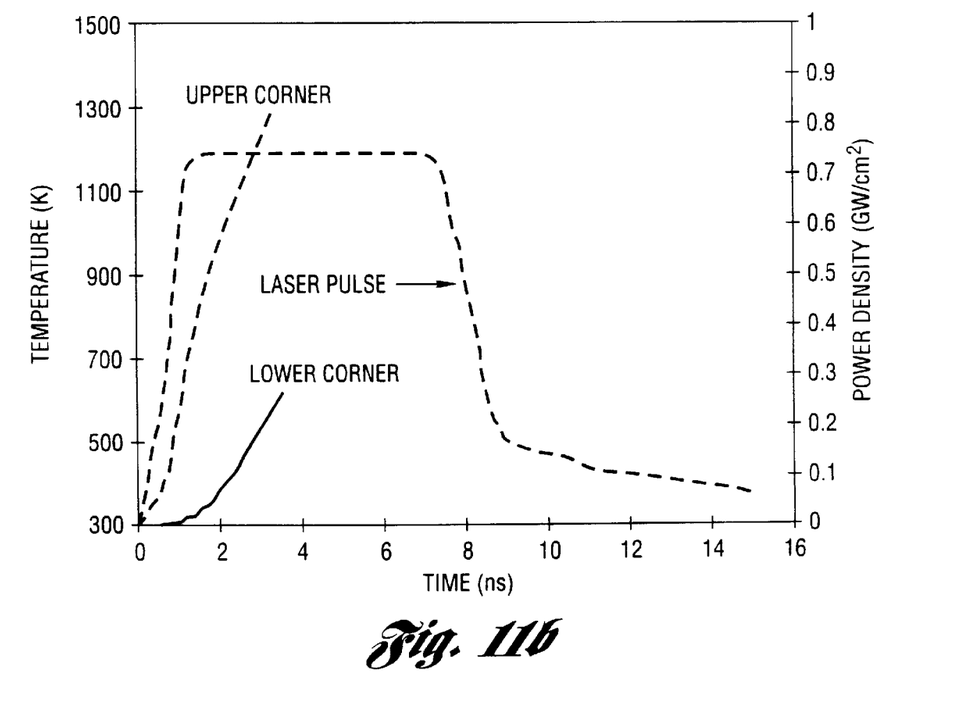

These characteristics provide a significant departure from the interaction observed with Q-switched systems. Furthermore, a computer finite element model was used to simulate the effects of the fast rising pulse for various material thickness and link sizes. The results independently confirmed the improved link blowing results with the use of a sharp rise time pulse with an approximate square distribution. The results of the computer model generated by Bernstein, author of reference number 3, are shown in FIGS. 11a and 11b. The following Tables A and B are associated with the graphs of FIGS. 11a and 11b, respectively:

TABLE A

| Model 1 @ 0.7 uJ | Square Pulse | Slow Rise Pulse |
|---|---|---|
| 1st Crack | 929K @ 1.88 ns | 978K @ 2.40 ns |
| 2nd Crack | 1180K @ 2.93 ns | 1380K @ 3.45 ns |
| 3rd Crack | 1400K @ 2.05 ns | No |
| 4th Crack | 1520K @ 4.73 ns | No |

Al thickness: 0.8 $\mu$m Al width: 0.8 $\mu$m
$SiO_2$: 0.1 $\mu$m $Si_3N_4$: 0.4 $\mu$m
Laser energy: 0.7 uJ

TABLE B

| Model 2 @ 0.7 uJ | Square Pulse | Slow Rise Pulse |
|---|---|---|
| 1st Crack | 974K @ 2.03 ns | 1050K @ 2.55 ns |
| 2nd Crack | No | No |
| 3rd Crack | No | No |
| 4th Crack | No | No |

Al thickness: 0.8 $\mu$m Al width: 0.8 $\mu$m
$SiO_2$: 0.6 $\mu$m $Si_3N_4$: 0.6 $\mu$m
Laser energy: 0.7 uJ The stress and temperature history indicate with certainty the importance of the fast rising pulse, with sub-nanosecond rise time. It is also known that if significant pulse energy is present, several nanoseconds after the ablation is completed, say at 15 ns, the Si can be damaged. A fast fall time, with a high extinction, is also important.

According to the invention, the silicon substrate is also kept relatively cool both by appropriate selection of wavelength and by limiting the pulse duration, with a correspondingly square pulse with fast decay. The laser wavelength in this example is slightly less than the room temperature absorption edge of silicon (about 1.1 $\mu$m). Although the results reported here did not indicate substrate damage, it should be noted that improved margins are available if desired. For example, the Raman shifter could be utilized to shift the output wavelength beyond the absorption edge. Alternatively, another diode laser wavelength could potentially become commercially available for a MOPA configuration. Such wavelength selection and shifting techniques may advantageously be utilized in other laser processing and micromachining applications. In any case, by thus limiting the heating, it is possible to ensure that the silicon does not shift its absorption edge into the infrared and enter a thermal runaway condition in which silicon damage can occur.

The specific embodiment of the MOPA configuration for fast pulse generation for cleanly blowing metal links is taken as an example of pulse shaping and is provided to be illustrative rather than restrictive. Through direction modulation of the seed laser, excellent sub-nanosecond control over the pulse shape was maintained, and found to be advantageous, including the possibility of fast compensation to correct the output pulse shape. Other applications in micromachining, marking, scribing, etc. could also benefit from precise, fast pulse control. For example, the seed diode could as easily be modulated with a "sawtooth" waveform or other non Q-switched waveshape for the purpose of creating or removing a specific feature on or within a surface. Likewise, because of the fast response of the laser diode, it is possible to generate a sequence of variable width, short pulses in rapid succession. Those skilled in the art of laser processing will recognize the broad application of the laser system herein. The scope of the invention is indicated by the following claims and is not to be otherwise restricted.

What is claimed is:

1. An energy-efficient, laser-based method for processing target material having a reflectivity and a specified dimension in a microscopic region without causing undesirable changes in electrical or physical characteristics of at least one material surrounding the target material, the method comprising:

generating a laser pulse train utilizing a laser having a wavelength at a repetition rate;

optically amplifying at least a portion of the pulse train to obtain an amplified pulse train wherein each of the amplified pulses has a temporal power density distribution, a sharp rise time, a pulse duration and a fall time; and delivering and focusing a plurality of closely-spaced pulses of the amplified pulse train to the target material wherein the power density distribution of the plurality of closely-spaced pulses is sufficiently high and the rise time is fast enough to efficiently couple laser energy to the target material and reduce reflectivity of the target material, and wherein the pulse duration of each of the amplified pulses is in the range of several picoseconds to about 10 nanoseconds and the fall time is rapid enough to prevent the undesirable changes to the at least one material surrounding the target material wherein the target material is processed in a thermal manner.

2. The method as claimed in claim 1 wherein the target material includes microstructures.

3. The method as claimed in claim 2 wherein the microstructures are conductive lines.

4. The method as claimed in claim 3 wherein the conductive lines are metal lines and wherein the pulse duration is sufficient to effectively heat and vaporize a specified portion of the metal lines.

5. The method as claimed in claim 1 wherein the target material is a part of a semiconductor device.

6. The method as claimed in claim 5 wherein the semiconductor is a semiconductor memory.

7. The method as claimed in claim 6 wherein the memory has a density of at least 16 and up to 256 megabits.

8. The method as claimed in claim 1 wherein at least a portion of the material surrounding the target material is a substrate.

9. The method as claimed in claim 8 wherein the substrate is a semiconductor substrate.

10. The method as claimed in claim 1 wherein the target material is part of a microelectronic device.

11. The method as claimed in claim 10 wherein the microelectronic device is a microelectromechanical device.

12. The method as claimed in claim 1 wherein the specified dimension is less than the laser wavelength.

13. The method as claimed in claim 1 wherein each of the pulses delivered to the target material has substantially the same power density distribution.

14. The method as claimed in claim 1 wherein the pulse duration of each pulse of the pulse train corresponds to a duration wherein a fluence threshold for material processing is substantially proportional to the square root of the pulse duration whereby the target material is processed in a thermal manner.

15. The method as claimed in claim 1 wherein the laser is a high speed, semiconductor laser diode.

16. The method as claimed in claim 15 wherein the laser diode has a wavelength less than about 2 $\mu$m.

17. The method as claimed in claim 1 wherein the spot has a dimension in the range of about 1 $\mu$m-4 $\mu$m.

18. The method as claimed in claim 15 wherein the laser diode is a multimode diode laser.

19. The method as claimed in claim 15 wherein the laser diode is a single frequency laser diode utilizing a distributed Bragg reflector (DBR), distributed feedback (DFB), or an external cavity design.

20. The method as claimed in claim 1 wherein each amplified pulse has a relatively uniform power density distribution throughout the pulse duration.

21. The method as claimed in claim 1 wherein each pulse has a temporal power density distribution uniform to within ten percent during the pulse duration.

22. The method as claimed in claim 1 wherein the at least one material surrounding the target material has optical properties and thermal diffusivity properties different from the corresponding properties of the target material.

23. The method as claimed in claim 22 wherein the optical properties include absorption.

24. The method as claimed in claim 22 wherein the optical properties include polarization sensitivity.

25. The method as claimed in claim 1 wherein the pulse duration is a function of the specified dimension.

26. The method as claimed in claim 1 wherein each of the amplified pulses has at least 0.1 and up to 3 microjoules of energy.

27. The method as claimed in claim 1 wherein the step of optically amplifying provides a gain of at least 20 DB.

28. The method as claimed in claim 1 wherein both the rise time and the fall time are less than one-half of the pulse duration and wherein peak power of each amplified pulse is substantially constant between the rise and fall times.

29. The method as claimed in claim 1 wherein each of the amplified pulses has a tail and further comprising attenuating laser energy in the tails of the amplified pulses to reduce fall time of the amplified pulses while substantially maintaining the amount of power of the pulses.

30. The method as claimed in claim 29 wherein the attenuated laser energy in the tails is attenuated by at least 20 dB within 1.5 times the pulse duration.

31. An energy-efficient, laser-based method for ablating a metal link having a reflectivity and a specified dimension supported by at least one passivation layer without causing undesirable changes in electrical or physical characteristics of the at least one passivation layer, the method comprising:

generating a laser pulse train utilizing a laser having a wavelength at a repetition rate;

optically amplifying at least a portion of the pulse train to obtain an amplified pulse train wherein each of the amplified pulses has a temporal power density distribution, a sharp rise time, a pulse duration and a fall time; and delivering and focusing a plurality of closely-spaced pulses of the amplified pulse train to the metal link wherein the power density distribution of the plurality of closely-spaced pulses is sufficiently high and rise time is fast enough to efficiently couple laser energy to the metal link and reduce reflectivity of the metal link, and wherein the pulse duration of each of the amplified pulses is in the range of several picoseconds to about 10 nanoseconds and the fall time is rapid enough to prevent the undesirable changes to the at least one passivation layer wherein the metal link is ablated in a thermal manner.

32. The method as claimed in claim 31 wherein the metal link is embedded in a top passivation layer thereover and a bottom passivation layer thereunder and wherein the pulse duration is sufficient to crack the top passivation layer but not the bottom passivation layer.

33. The method as claimed in claim 31 wherein the power density distribution is substantially square.

34. An energy-efficient system for processing target material having a reflectivity and having a specified dimension in a microscopic region without causing undesirable changes in electrical or physical characteristics of at least one material surrounding the target material, the system comprising:

a controller for generating a processing control signal;

a signal generator for generating a modulated drive waveform based on the processing control signal, wherein the waveform has a sub-nanosecond rise time;

a gain-switched, pulsed seed laser having a wavelength for generating a laser pulse train at a repetition rate;

a laser amplifier for optically amplifying at least a portion of the pulse train to obtain an amplified pulse train wherein each of the amplified pulses has a temporal power density, a sharp rise time, a pulse duration and a fall time; and a beam delivery and focusing subsystem for delivering and focusing a plurality of closely-spaced pulses of the amplified pulse train to the target material wherein the power density distribution of the plurality of closely-spaced pulses is sufficiently high and the rise time is fast enough to efficiently couple laser energy to the target material and reduce reflectivity of the target material, and wherein the pulse duration of each of the amplified pulses is in the range of several picoseconds to about 10 nanoseconds, and the fall time is rapid enough to prevent the undesirable changes to the at least one material surrounding the target material wherein the target material is processed in a thermal manner.

35. The system as claimed in claim 34, wherein at least a portion of the at least one material surrounding the target material is a substrate.

36. The system as claimed in claim 35, wherein the substrate is a semiconductor substrate.

37. The system as claim in claim 34, wherein the target material is part of a microelectronic device.

38. The system as claimed in claim 37, wherein the microelectronic device is a microelectromechanical device.

39. The system as claimed in claim 34, wherein the pulse duration of each pulse of the pulse train corresponds to a duration wherein a fluence threshold for material processing is substantially proportional to the square root of the pulse duration whereby the target material is processed in a thermal manner.

40. The system as claimed in claim 34, wherein each of the amplified pulses has at least 0.1 and up to 3 microjoules of energy.

41. The system as claimed in claim 34, wherein the seed laser includes a modified Q-switched system.

42. The system as claimed in claim 34, wherein the target material has a specific dimension and wherein the specified dimension is less than the wavelength.

43. The system as claimed in claim 34, further comprising an optical switch and a computer coupled to the optical switch and the subsystem for selecting material processing pulses of the pulse train and to control position of the selected pulses relative to the target material.

44. A method of severing electrically conductive memory links positioned between respective pairs of electrically conductive contacts in a circuit fabricated on a substrate, the method comprising:

generating processing control signals representing one or more locations of electrically conductive memory links in the circuit;

generating at least two closely spaced laser output pulses, each of the laser output pulses having a pulse duration in the range of several picoseconds to about 10 nanoseconds; and directing, in response to the processing control signals, the laser output pulses to impinge a first electrically conductive redundant memory link at a first location between first contacts, the output pulses severing the first conductive link between the first contacts wherein the link is removed by a thermal interaction with the laser output pulses without damaging the underlying substrate.

45. The method of claim 44, wherein each link forms a portion of a link structure that includes a passivation layer that overlies the link.

46. The method of claim 45, wherein the passivation layer is removed by a thermal interaction among the laser output pulses, the link, and the passivation layer.

47. The method of claim 44, wherein wavelength of the laser output pulses is within a range from the visible (0.4 microns) to about 2 microns.

48. The method claim 44, wherein the step of generating the at least two closely spaced laser optical pulses includes producing laser seed pulses and amplifying the seed pulses.

49. The method of claim 44, wherein the laser output pulses have similar energy density profiles.

50. The method of claim 44, wherein each of the laser output pulses has approximately the same intensity.

51. The method of claim 44, wherein the laser output pulses are shaped to match an energy density profile of a multiple-nanosecond link-processing laser pulse having a substantially square temporal pulse shape.

52. The method of claim 44, wherein the links have a width that is less than one micron and the wavelength of the laser output pulses falls within the infrared region.

53. The method claim 44, wherein the passivation layer overlying the link has a thickness of about 0.3–0.5 microns.

54. The method of claim 44, wherein the link has a thickness of less than about 0.3 micron.

55. The method of claim 44, wherein the plurality of closely spaced amplified pulses provides at least 0.1 microjoules of output energy and up to about 3 microjoules of energy.

56. The method of claim 44, wherein each laser output pulse produces a laser spot on the target of in the range of about 1 micron to 4 microns.

57. A system for severing electrically conductive memory links positioned between respective pairs of electrically conductive contacts in a circuit fabricated on a substrate, comprising:

a controller for generating processing control signals representing one or more locations of electrically conductive memory links in the circuit;

laser means for generating at least two closely spaced laser output pulses during a first time interval, each of the laser output pulses having a pulse duration in the range of several picoseconds to about 10 nanoseconds; and means for directing, in response to the processing control signals, the laser output pulses to impinge a first electrically conductive memory link at a first location between first contacts, the output pulses severing the first conductive link between the first contacts;

wherein the link is removed by a thermal interaction with the laser output pulses without damaging the underlying substrate.

58. The system of claim 57, wherein the laser means includes a seed laser diode and an optical amplifier.

* * * * *

UNITED STATES PATENT AND TRADEMARK OFFICE
CERTIFICATE OF CORRECTION

PATENT NO. : 6,727,458 B2
DATED : April 27, 2004
INVENTOR(S) : Donald V. Smart

It is certified that error appears in the above-identified patent and that said Letters Patent is hereby corrected as shown below:

Column 20,
Line 10, after "of the" insert -- at least one --.

Signed and Sealed this

Seventeenth Day of August, 2004

JON W. DUDAS
*Acting Director of the United States Patent and Trademark Office*